United States Patent
Bai et al.

(10) Patent No.: US 8,902,000 B2
(45) Date of Patent: Dec. 2, 2014

(54) SIGNAL SPLITTING APPARATUS SUITABLE FOR USE IN A POWER AMPLIFIER

(71) Applicants: Chunlong Bai, San Diego, CA (US); Bradley John Morris, Ottawa (CA)

(72) Inventors: Chunlong Bai, San Diego, CA (US); Bradley John Morris, Ottawa (CA)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 0 days.

(21) Appl. No.: 14/153,338

(22) Filed: Jan. 13, 2014

(65) Prior Publication Data

US 2014/0184325 A1    Jul. 3, 2014

Related U.S. Application Data

(63) Continuation of application No. 13/290,503, filed on Nov. 7, 2011, now Pat. No. 8,629,718.

(51) Int. Cl.
*H03F 3/68* (2006.01)

(52) U.S. Cl.
USPC .......................... 330/124 R; 330/295; 330/53

(58) Field of Classification Search
USPC ....................................... 330/124 R, 295, 53
IPC ........................................................ H03F 3/68
See application file for complete search history.

(56) References Cited

U.S. PATENT DOCUMENTS

| | | | | |
|---|---|---|---|---|
| 3,732,371 | A * | 5/1973 | Burwen | 381/106 |
| 5,075,678 | A * | 12/1991 | Ohlsson et al. | 341/131 |
| 5,949,283 | A * | 9/1999 | Proctor et al. | 330/149 |
| 6,104,241 | A * | 8/2000 | Cova et al. | 330/149 |
| 6,111,462 | A * | 8/2000 | Mucenieks et al. | 330/149 |
| 6,993,301 | B1 * | 1/2006 | Kenington et al. | 455/114.3 |
| 7,091,779 | B2 * | 8/2006 | Sahlman | 330/149 |
| 7,397,872 | B2 * | 7/2008 | Komori et al. | 375/345 |
| 8,022,768 | B1 | 9/2011 | Bowles | |

* cited by examiner

*Primary Examiner* — Patricia Nguyen

(57) ABSTRACT

Disclosed is a signal splitting apparatus useable in a power amplifier having two or more power amplifiers. The apparatus includes a direct gain component; and a derived gain component connected to the direct gain component. The derived gain component derives the derived gain by imposing a constraint which is valid over the entire dynamic range of the input signal, e.g. the sum of the power of the direct split signal and the derived split signal are constrained to be substantially equal to the power of the input signal. The use of combining additional direct gain and derived gain components, as well as a delay element, are disclosed so as to enable n-component splitting that for adaptation to different applications by the use of suitable coefficients.

25 Claims, 10 Drawing Sheets

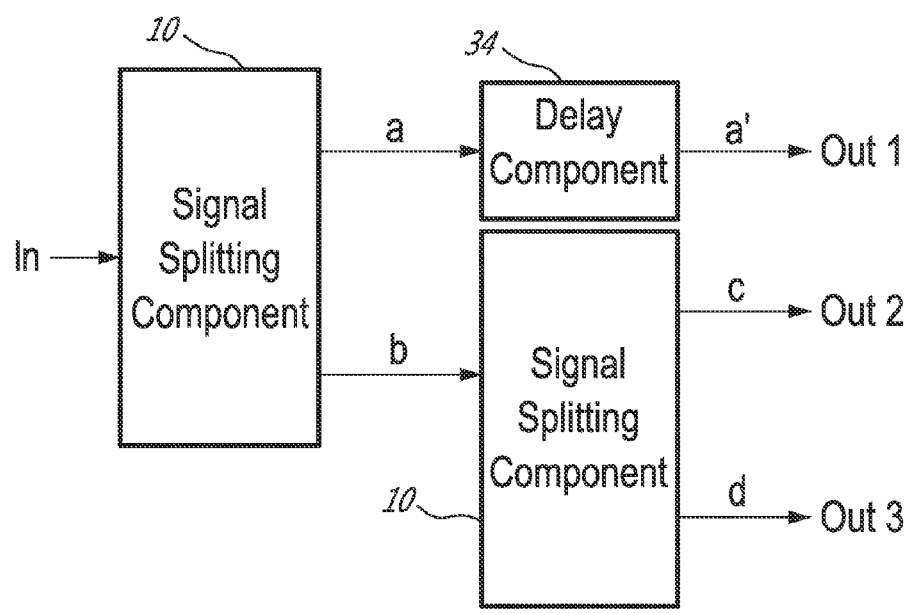

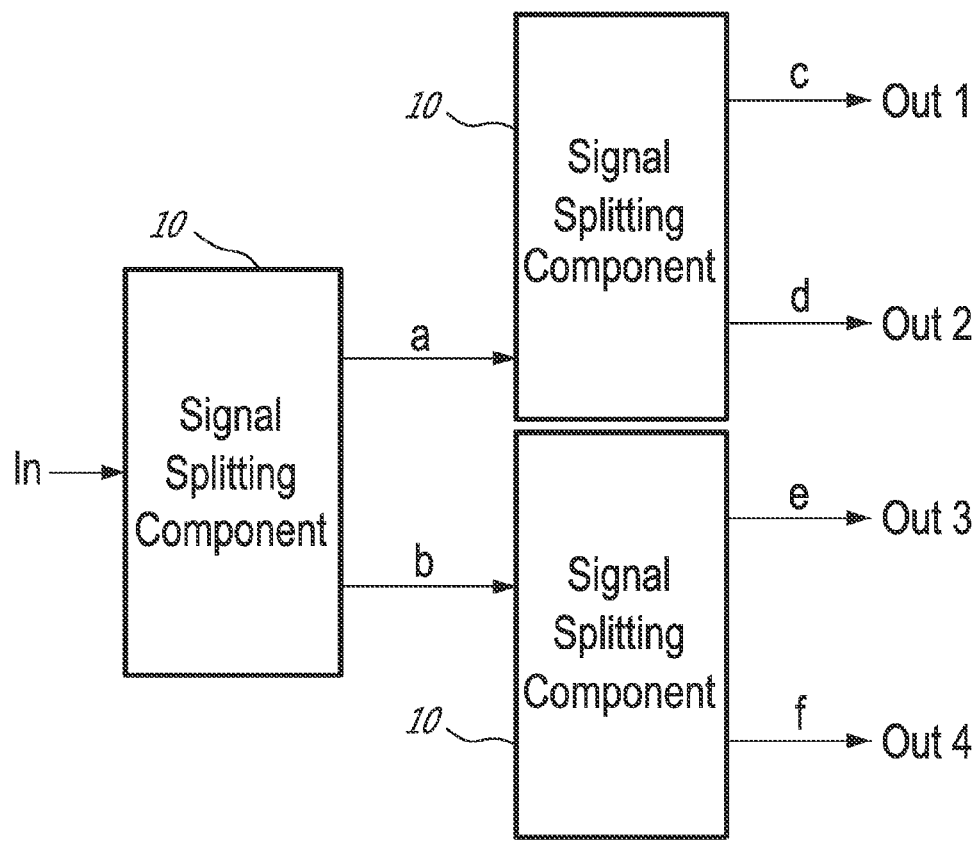

SIGNAL SPLITTING APPARATUS SUITABLE FOR USE IN A POWER AMPLIFIER

CROSS-REFERENCE TO RELATED APPLICATIONS

This is a continuation of U.S. patent application Ser. No. 13/290,503 filed on Nov. 7, 2011, now allowed, which is incorporated by reference in its entirety herein.

TECHNICAL FIELD

The present application relates to high efficiency power amplifiers used in radio communications in general and, more particularly, to a technique of signal splitting suitable for use in a high efficiency power amplifier having a main power amplifier component and at least one auxiliary power amplifier component.

BACKGROUND OF THE APPLICATION

A typical RF transmit and receive chain are shown in FIGS. 1a and 1b respectively. The transmit circuitry includes a power amplifier (PA) system. In PA system design, one major design goal is high efficiency, which is especially important for wireless applications. For example, high power is desirable for a base station to increase range, whereas low power is desired in a terminal to reduce power consumption One way to improve the efficiency performance of a PA system is to add additional PA components in the system, such as by providing a 2-component PA system, as illustrated in FIG. 2.

SUMMARY

According to a first aspect of the present application, there is provided as signal splitting apparatus suitable for use in a power amplifier having two or more power amplifier components. The apparatus includes a direct gain component, for receiving an input signal and for providing a direct gain which when multiplied by the input signal provides a direct split signal; and a derived gain component connected to said direct gain component, for receiving the direct gain and for providing a derived gain which when multiplied by the input signal provides a derived split signal.

In some embodiments, the direct gain component includes an amplitude component, an address generator, and a look-up table component such that the amplitude component operates directly on the input signal to provide an amplitude which is mapped to an address by the address generator, the address then being used to look-up the value of the direct gain in the look-up table.

In some embodiments, the direct gain component includes a static memory structure for storing $Q_s$ samples of the input signal and providing P data taps, and a static combining structure for combining the products of the P data taps with P coefficients to provide the direct gain.

In some embodiments, the derived gain component derives the derived gain from the direct gain by imposing a constraint which is valid over the entire dynamic range of the input signal.

In some embodiments, the constraint is that the sum of the power of the direct split signal and the derived split signal is substantially equal to the power of the input signal.

In some embodiments, the derived gain component includes a square root component such that the square root component produces the derived gain by taking the square root of unity minus the square of the direct gain.

In some embodiments, the derived gain component includes a multiplier to implement the square of the direct gain by multiplying the direct gain with itself.

In some embodiments, the derived gain component includes an adder for implementing the unity minus the square of the direct gain by subtracting the square of the direct gain from unity.

In some embodiments, the signal splitting apparatus further comprises a second direct gain component, for receiving a second input signal including one of the direct signal and the derived signal and for providing a second direct gain which when multiplied by the second input signal provides a second direct split signal; and a second derived gain component connected to said second direct gain component, for receiving the second direct gain and for providing a second derived gain which when multiplied by the second input signal provides a second derived split signal.

In some embodiments, the second derived gain component derives the second derived gain from the second direct gain by imposing a second constraint which is valid over the entire dynamic range of the second input signal.

In some embodiments, the second constraint is that the sum of the power of the second direct split signal and the second derived split signal is substantially equal to the power of the second input signal.

In some embodiments, the second derived gain component includes a square root component such that the square root component produces the second derived gain by taking the square root of the square of one of the direct gain and the derived gain minus the square of the second direct gain.

In some embodiments, the second derived gain component includes a multiplier to implement the square of the second direct gain by multiplying the second direct gain with itself.

In some embodiments, the second derived gain component includes a multiplier to implement the square of one of the direct gain and the derived gain by multiplying the one of the direct gain and the derived gain with itself.

In some embodiments, the second derived gain component includes an adder for implementing the square of one of the direct gain and the derived gain minus the square of the second direct gain by subtracting the square of the second direct gain from the square of one of the direct gain and the derived gain.

In some embodiments, the signal splitting apparatus further includes a delay element for receiving one of the direct split signal and the derived split signal and for providing a delayed split signal having a delay substantially equal to the time required to produce the respective other of the direct split signal and the derived split signal.

In some embodiments, the signal splitting apparatus further includes a third direct gain component, for receiving a third input signal including one of the second direct signal and the second derived signal and for providing a third direct gain which when multiplied by the third input signal provides a third direct split signal; and a third derived gain component connected to said third direct gain component, for receiving the third direct gain and for providing a third derived gain which when multiplied by the third input signal provides a third derived split signal.

In some embodiments, the signal splitting apparatus further includes one or more additional direct gain components and one or more additional derived gain components, each connected to said one or more additional direct gain components.

According to a second aspect of the present application, there is provided a radio frequency transmit circuit including a high-efficiency power amplifier, the high-efficiency power amplifier including a signal splitting apparatus as provided by the first aspect of the present application.

In some embodiments, the high-efficiency power amplifier employs a Doherty, Chirex or other suitable topology.

Other aspects and features of the present application will become apparent to those ordinarily skilled in the art upon review of the following description of specific embodiments of a signal splitting apparatus suitable for use in a power amplifier in conjunction with the accompanying drawing figures.

BRIEF DESCRIPTION OF THE DRAWINGS

Embodiments of the present application will now be described, by way of example only, with reference to the accompanying drawing figures, wherein:

FIG. 9A is a block diagram view of a 3-way derived signal splitting component;
FIG. 9B shows constraints corresponding to the embodiment of FIG. 9A;
and
FIG. 10A is a block diagram view of a 4-way derived signal splitting component;
and
FIG. 10B shows constraints corresponding to the embodiment of FIG. 10A.

Like reference numerals are used in different figures to denote similar elements.

DETAILED DESCRIPTION OF THE DRAWINGS

Figure 1:
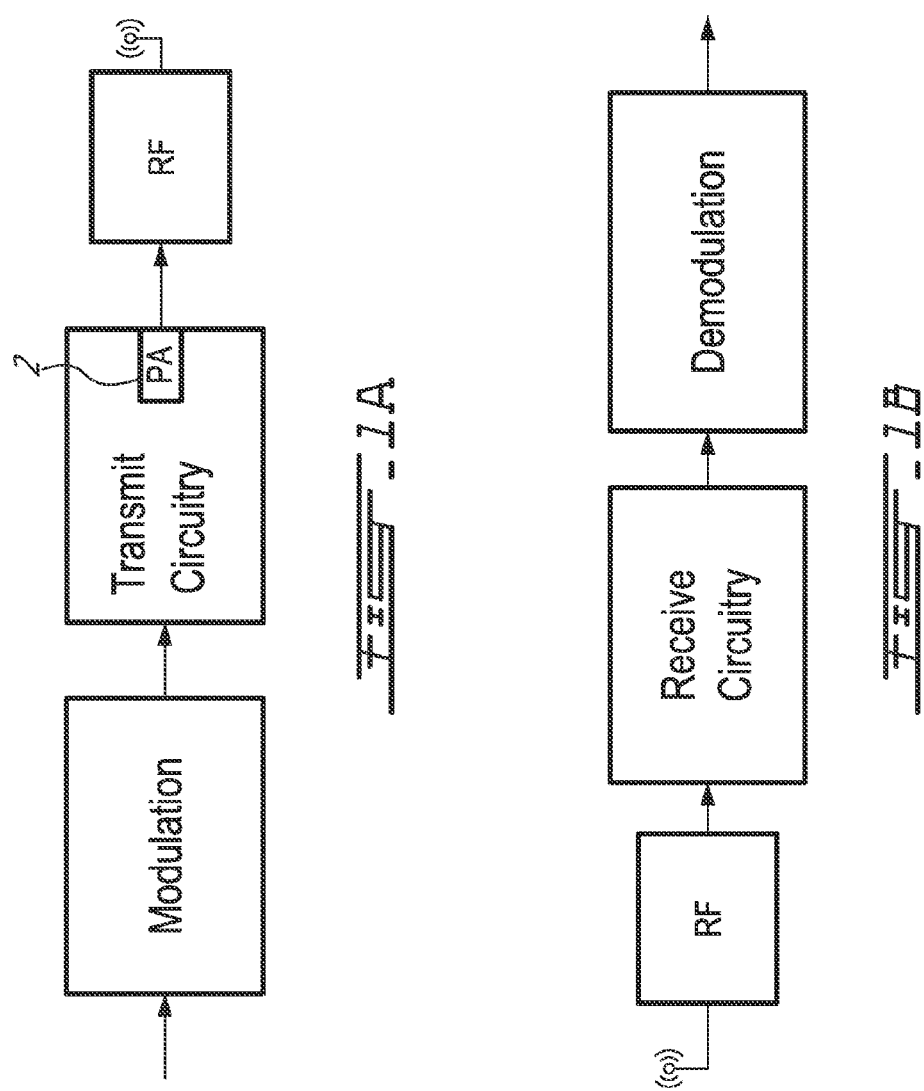
FIG. 1A is a block diagram view of an RF transmit chain.
FIG. 1B is a block diagram view of an RF receive chain.

Referring to the drawings, a typical RF transmit and receive chain are shown in FIGS. 1A and 1B respectively. The transmit circuitry includes a power amplifier 2 (PA) system. In PA system design, one major design goal is high efficiency, which is especially important for wireless applications. For example, high power is desirable for a base station to increase range, whereas low power is desired in a terminal to reduce power consumption.

Figure 2:
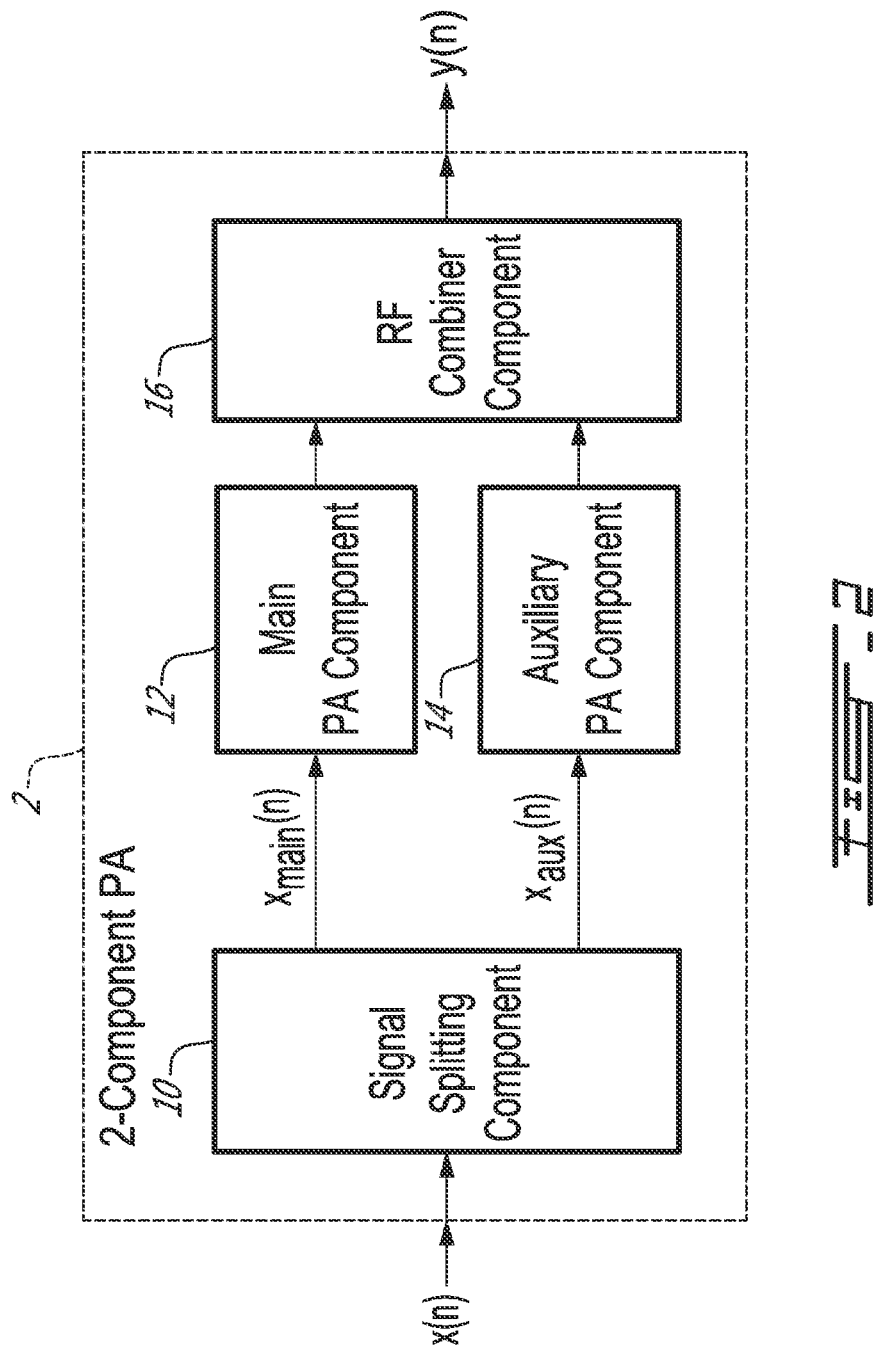
FIG. 2 is a block diagram view of a 2-component PA system.

One way to improve the efficiency performance of a PA system is to add additional PA components in the system, such as by providing a 2-component PA system, as illustrated in FIG. 2, which shows a power amplifier 2 that includes a signal splitting component 10, a main power amplifier component 12, an auxiliary power amplifier component 14, and an RF combiner component 16. An input signal x(n) is received by the signal splitting component 10, which splits the input signal into a main split signal $x_{main}(n)$ and an auxiliary split signal $x_{aux}(n)$. The main split signal is input to a main power amplifier component 12 whereas the auxiliary split signal is input to an auxiliary power amplifier component 14. An RF combiner component 16 combines the output of the main power amplifier component 12 and the auxiliary power amplifier component 14 to produce the output signal y(n).

One example of a 2-component PA system is the enhanced Doherty PA system, where one PA component works as the main PA, and is biased on all the time, while the other works as the auxiliary PA (or also known as the peak PA), and is only turned on when the signal level is above a threshold.

Another example of a 2-component PA system is a Chirex PA system, wherein the input signal is split in to two antiphase signals, which are amplified by two identical power amplifiers and afterwards are added up again to obtain an amplified version of the original waveform. Signal splitting is both necessary and unavoidable in a 2-component PA system in order to split the input signal into two signals, each going into one PA component of the 2-component PA system.

Figure 3:
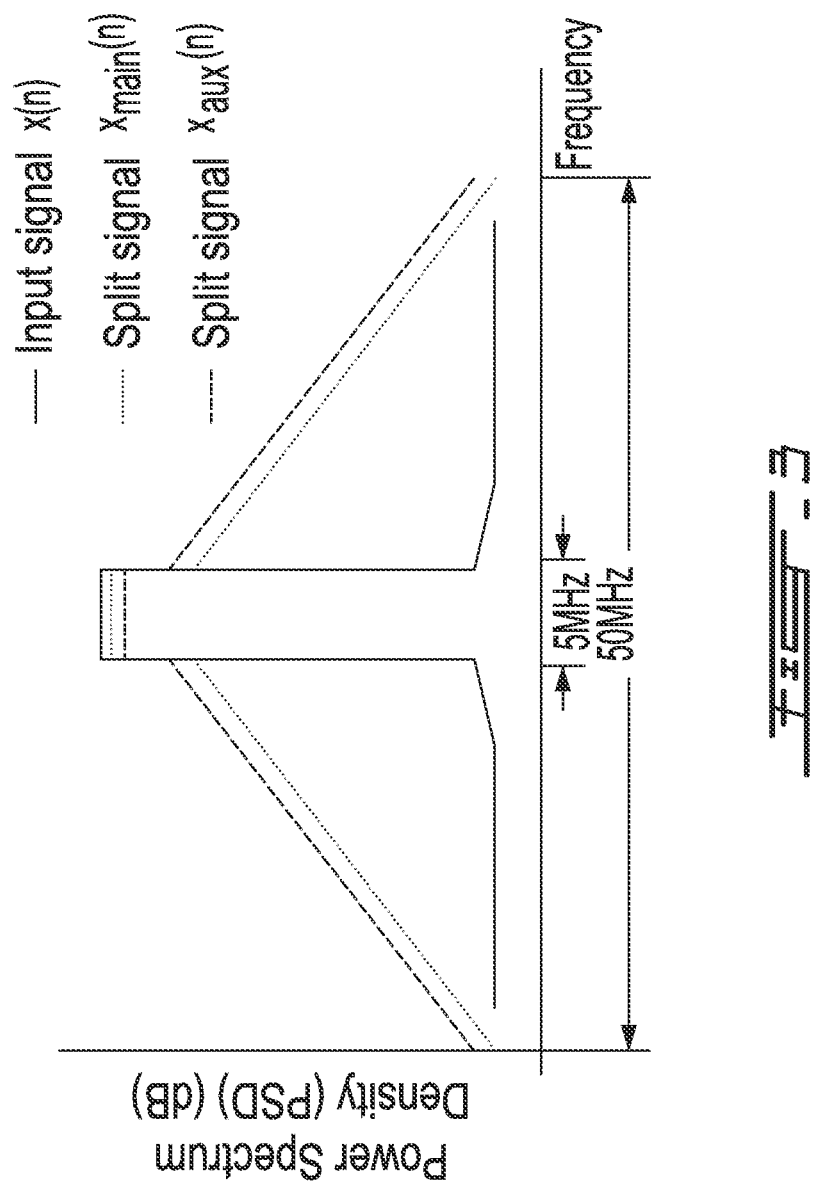
FIG. 3 is a graph view of a power spectrum density versus frequency of an input signal and two split signals.

Signal splitting in the signal splitting component 10 can be implemented using non-linear functions meaning they may introduce bandwidth expansions to the signals being split. In other words, the bandwidth of the output signals is wider than that of the input signal. This bandwidth expansion can be significant such that the bandwidth of the output signal is several times that of the input signal, as illustrated in FIG. 3.

Figure 4:
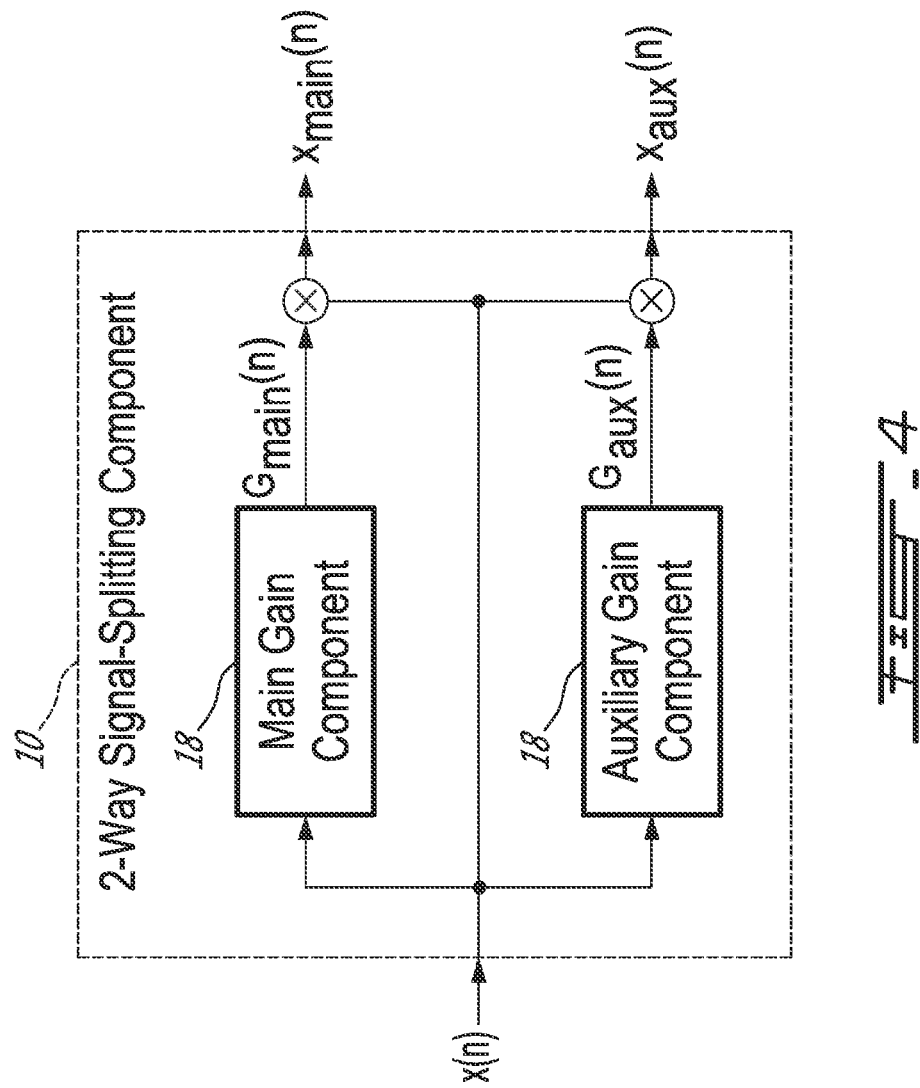
FIG. 4 is a block diagram view of a 2-way signal-splitting component.

FIG. 4 illustrates an embodiment of a direct signal splitting component 10 featuring two direct gain components provided in accordance with one aspect of the present application. The direct signal splitting component 10 includes a main gain component and an auxiliary gain component, both of which are instances of a direct gain component 18 in accordance with the present application since they depend on an input signal x(n) directly to produce a direct gain, $G_{main}(n)$ and $G_{aux}(n)$ respectively.

Since the direct signal splitting component 10 may affect signal bandwidth expansion and PA system efficiency, desired attributes for improving a 2-component PA system include: low (signal) bandwidth expansion, high (PA) efficiency, and ease of implementation.

Operationally, the main and auxiliary direct gain component 18 signal splitting functions first generate two gain factors which are then multiplied to the input signal to obtain the split signals.

With this approach, the signal splitting component 10 functionality can be expressed using gain functions wherein:
x(n) is the input to the signal splitting component 10. It is the PA system input signal;
$x_{main}(n)$ and $x_{aux}(n)$ are the outputs from the signal splitting component 10, and are the inputs to the main power amplifier component 12 and the auxiliary power amplifier component 14 of FIG. 2;
$G_{main}(n)$ is the gain factor for the main power amplifier component 12 input such that $x_{main}(n)=G_{main}(n)\times(n)$;
$G_{max}(n)$ is the gain factor for the auxiliary power amplifier component 14 input such that $x_{aux}(n)=G_{aux}(n)\times(n)$; and
since both the main gain component and the auxiliary gain component are instances of a direct gain component 18 in accordance with the present application, it is possible to express their respective gain factors using respective gain functions $g_{main}$ and $g_{aux}$ such that $G_{main}(n)=g_{main}(x(n))$ and $G_{aux}(x(n))$ respectively, where x(n) is a vector which may include past values of x(n), e.g. x(n−1), x(n−2), etc. e.g. $x(n)=[x(n), x(n-1), \ldots, x(n-Q_s+1)]^T$, where Qs is the maximum number of samples involved in the model.

Figure 5:
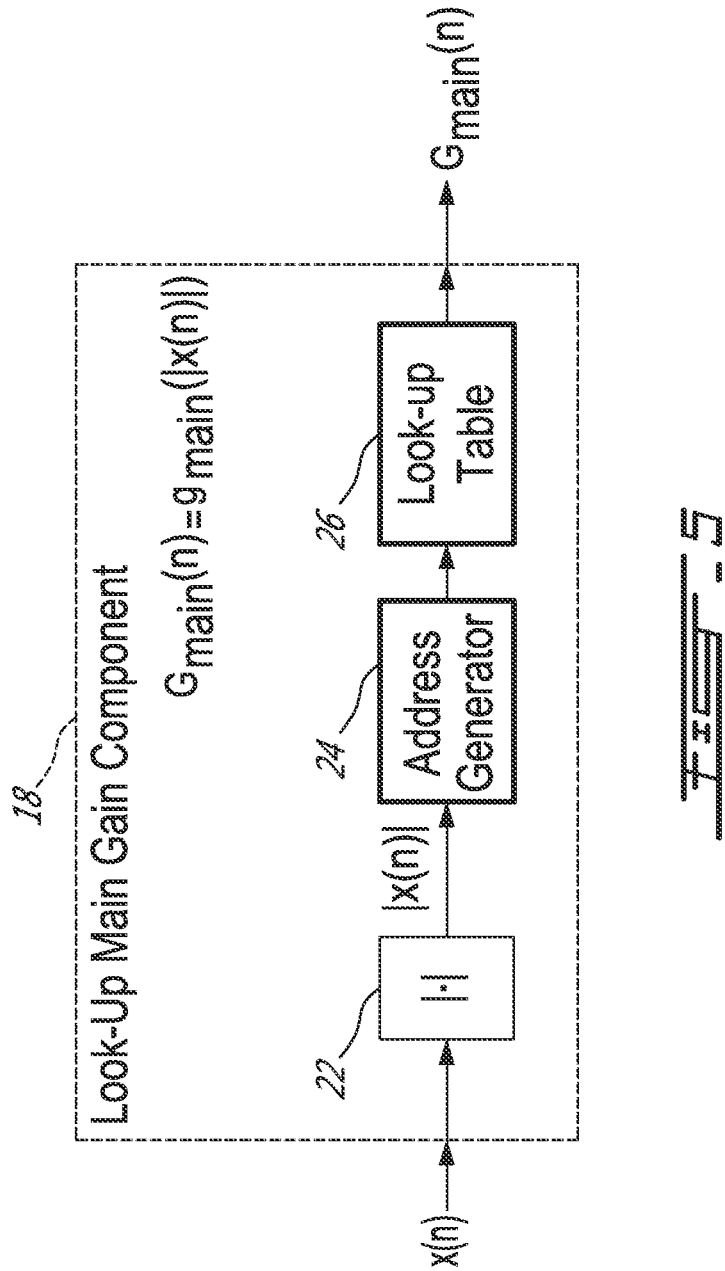
FIG. 5 is a block diagram view of a look-up based direct gain component.

FIG. 5 illustrates a 1 dimensional (1D) look-up table to provide the main gain factor by implementing a direct gain component 18 using a gain function $g_{main}$. The direct gain component 18 includes an amplitude component 22, an address generator 24, and a look-up table component 26. The implementation is such that the gain factor $G_{main}(n)$ is determined by the amplitude of the current input signal as $G_{main}(n)=g_{main}(|x(n)|)$. The gain function $g_{main}$ in this case is the result of the amplitude component 22 operating directly on the input signal x(n) to provide an amplitude which is mapped to an address by the address generator 24. The address is then used to look-up the value of the direct gain $G_{main}(n)$ using the look-up table component 26.

Although not shown in the drawing, the auxiliary gain factor could be implemented using the direct gain component 18 of FIG. 5, albeit with different instances of the address generator 24 and look-up table component 26 specific to the requirements of the auxiliary gain function $g_{aux}$.

In the 1D LUT implementations, only the amplitude of the current input signal sample is used to determine the gain factors. The implementation has the following features: the gain factor only depends on the amplitude of the current input signal; and the gain factor is independent of previous input signals.

With this approach, the gain function is frequency independent. In a system where the instantaneous signal bandwidth (IBW) is relatively small compared to the carrier frequency, for example, a 10 MHz signal over a 2 GHz carrier, usually the variation of the desired signal splitting function in the signal bandwidth is insignificant, and can be approximated by a frequency independent function. However, if the instantaneous signal bandwidth (IBW) increases, the variation of the desired signal is no longer insignificant compared to the carrier frequency, for example, in a system with a 100 MHz signal over a 1 GHz carrier. Consequently, the direct gain component 18 illustrated in FIG. 6 is disclosed to at least address frequency dependant applications.

Figure 6:
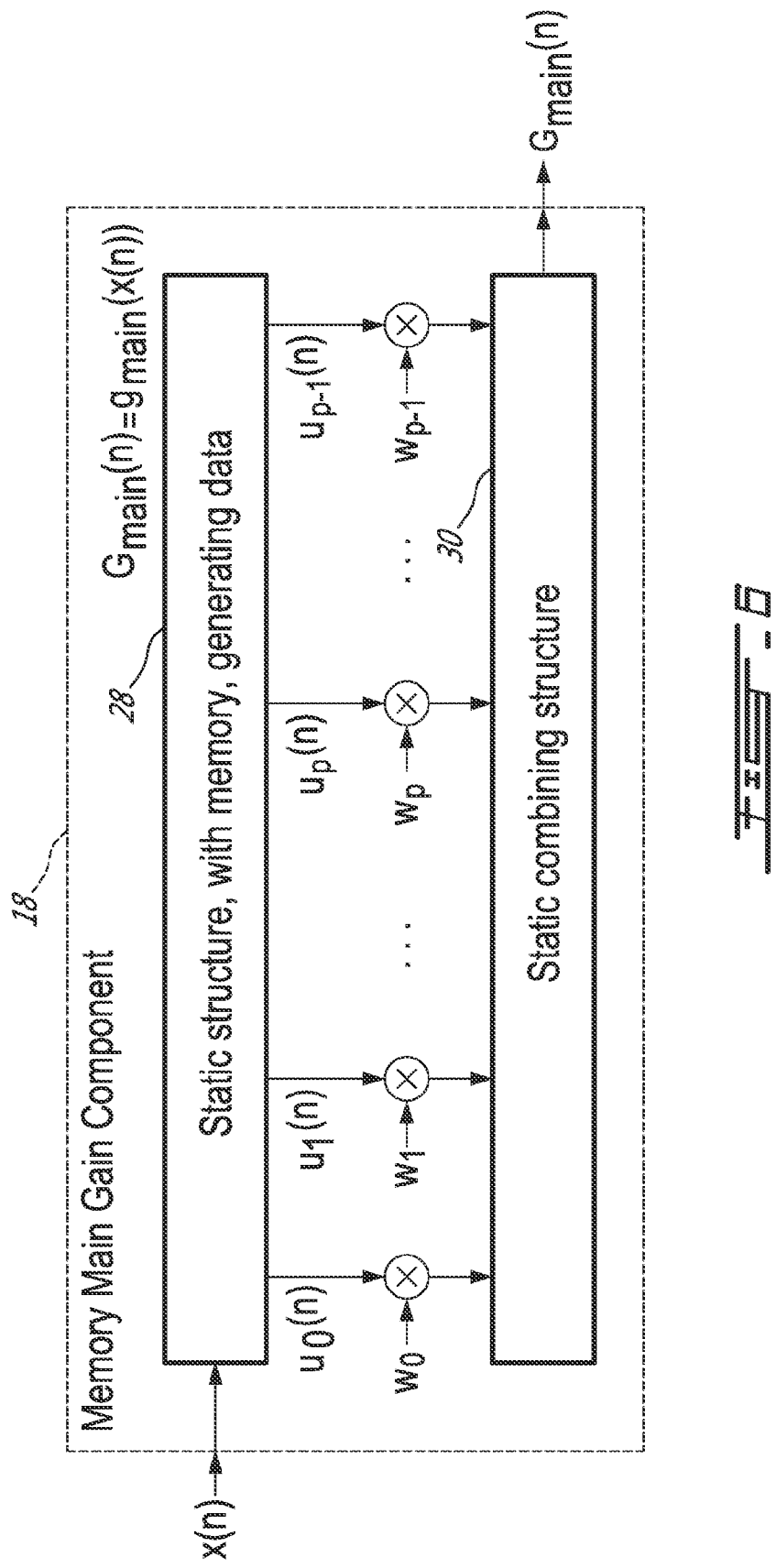
FIG. 6 is a block diagram view of a memory based direct gain component.

FIG. 6 illustrates a memory based direct gain component 18 to provide the main gain factor by using a frequency dependent $g_{main}$ function. The direct gain component 18 includes a static memory structure 28 and a static combining structure 30. The gain factor $G_{main}(n)$ is still a direct function of the input, but as compared to the instance of FIG. 5, in this case the input signal is a vector of current and previous input signal samples denoted by $x(n)=[x(n), x(n-1), \ldots, x(n-Q_s+1)]^T$, where Qs is the maximum number of samples involved in the model, whereby $G_{main}(n)=g_{main}(u(n) \cdot w)$. P denotes the number of coefficients in the static memory structure 28 that has P taps, whereas the vector $u(n)=[u_0(n), u_1(n), \ldots, u_{P-1}(n)]^T$ denotes the data samples at all taps in the model at a given time index n. The vector u(n) is multiplied by a coefficient vector $w=[w_0, w_1, \ldots, w_{P-1}]^T$. A static combining structure 30 combines the products of the data samples and the coefficients and produces the gain factor $G_{main}(n)$. Although not shown in the drawing, a simpler structure could be used by only taking the absolute values of x(n).

Although not shown in the drawing, the auxiliary gain factor could be implemented using the direct gain component 18 of FIG. 6, albeit with different instances of the number of samples involved $Q_s$, and different coefficient vector w.

On one hand, the memory based implementation has its benefits as it enables implementing a frequency dependent signal splitting function; and it provides more degrees of freedom for the fundamental optimization problem for the signal splitting function, achieving better system efficiency. On the other hand, the memory based approach presents challenges. The gain functions each contain multiple coefficients to be optimized. The structures involve multipliers and adders, and therefore may be costly to build and may consume a significant amount of power during operation.

Figure 7:
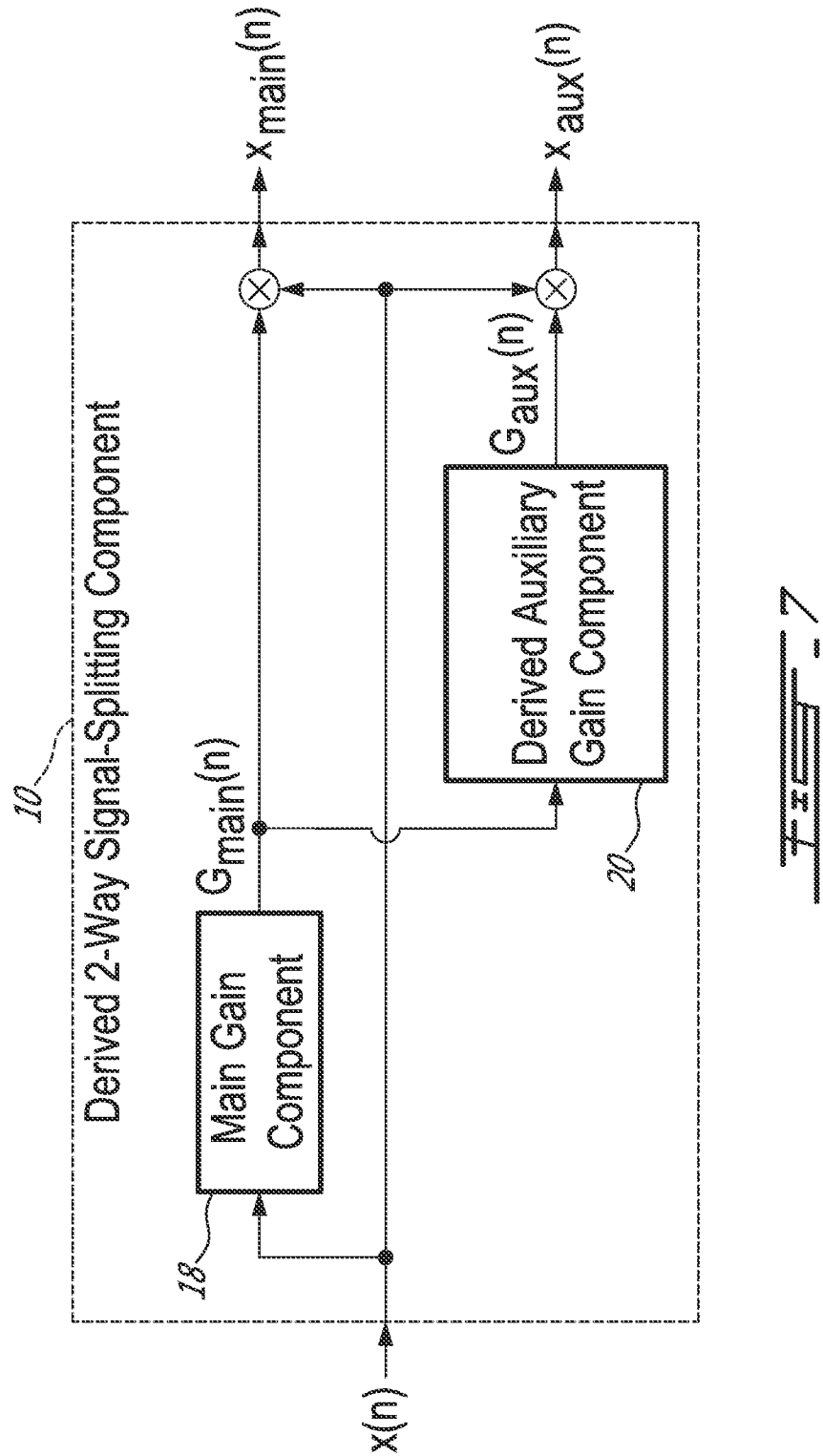
FIG. 7 is a block diagram view of a derived 2-way signal splitting component.

Referring now to FIG. 7, a derived signal splitting component 10 is illustrated featuring both a direct gain component 18 and a derived gain component 20, provided in accordance with the present application. The derived signal splitting component 10 includes a main gain component and an auxiliary gain component, each of which are instances of a direct gain component 18 and a derived gain component 20 respectively in accordance with the present application since the main gain component depends directly on the input signal x(n) to produce a direct gain, $G_{main}(n)$, and the derived gain component 20 depends on a direct gain $G_{main}(n)$ to produce a derived gain $G_{aux}(n)$. This structure is capable of at least addressing the use of gain functions implemented by memory based structures such as the one in FIG. 6 in particular and any structure more sophisticated than a 1D LUT of FIG. 5 in general, and can also be used with a 1D LUT such as the one in FIG. 5 as well.

Advantageously, instead of implementing the auxiliary gain function using the same sophisticated structure of the main gain function, the embodiment of FIG. 7 implements a block that derives the auxiliary gain factor from the value of the output of the direct gain component 18 in this case, the main gain factor $G_{main}(n)$.

Figure 8:
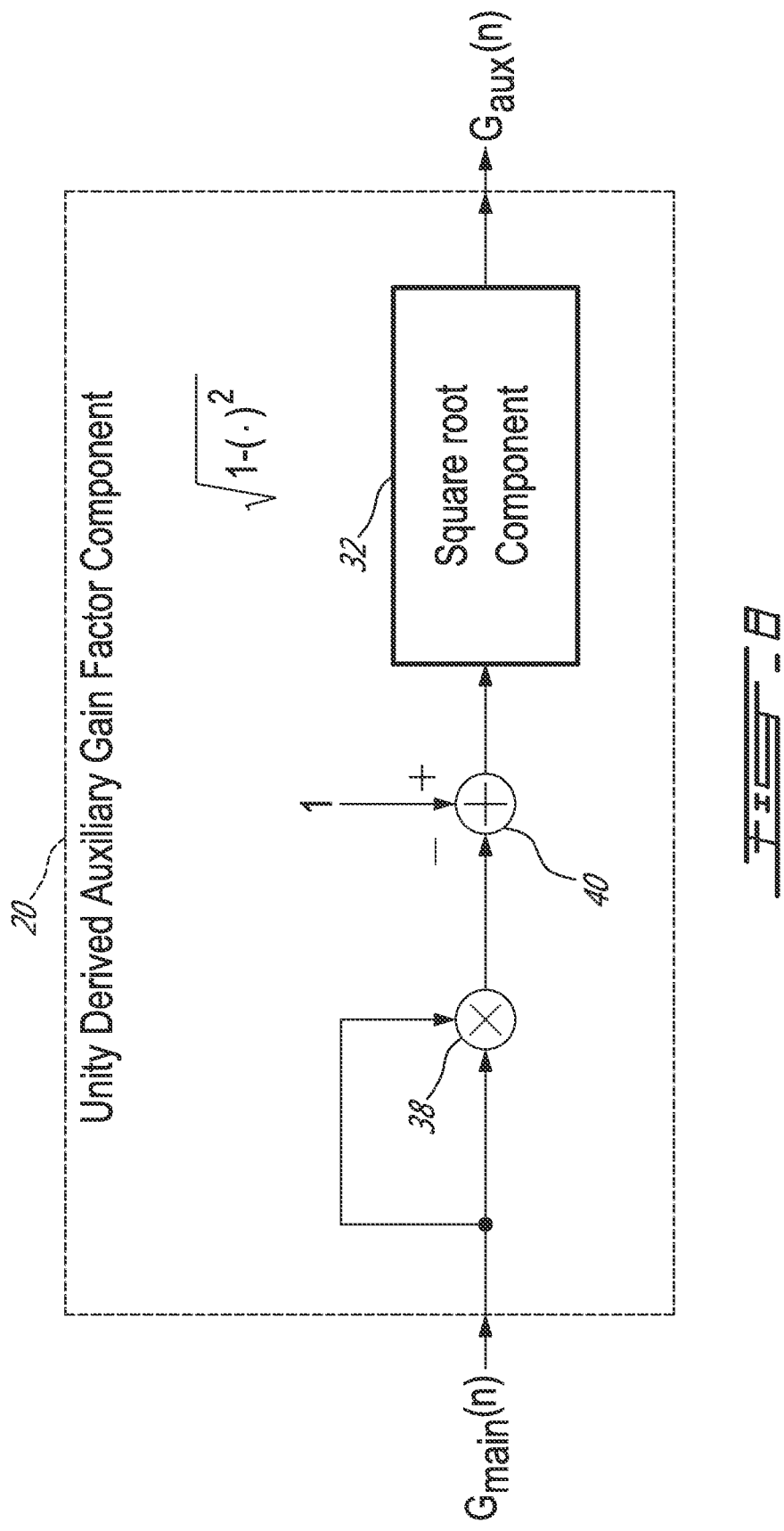
FIG. 8 is a block diagram view of a derived gain factor component.

Referring now to FIG. 8, an instance of the derived gain component 20 is illustrated. The derived gain component 20 includes a multiplier 38, an adder 40 and a square root component 32.

Operationally, in order for the signal splitting component 10 of FIG. 7 to not introduce any gain to the input signal, the signal splitting functions $g_{main}$ and $g_{aux}$ are constrained to satisfy the unity constraint by the illustrated instance of the derived gain component 20: the sum of the power of the split signals equals the power of the input signal over the entire dynamic range of x(n): $G_{main}(n)^2+G_{aux}(n)^2=1$. Thus, in this example where the unity constraint is used to derive the auxiliary gain from the main gain, the derived gain component 20 implements the function $G_{aux}(n)=\sqrt{(1-G_{main}(n)^2)}$.

The unity constraint is a strong constraint since it involves all the coefficients, so by deriving the auxiliary gain from the main gain, the problems of reducing the complexity of the signal splitting component 10 are addressed. However since the complexity of the derived gain component 20 advantageously exhibits fixed complexity regardless of the choice of direct gain component 18, reduced complexity can be achieved without sacrificing the ability to make the signal splitting component 10 frequency dependent or dependent on a sufficiently large number of parameters to facilitate optimization.

In alternative embodiments, the square root circuit component can be implemented in the way described in: S. E. McQuillan and J. V. McCanny, 'Fast VLSI algorithms for division and square root', The Journal of VLSI Signal Processing, Volume 8, Number 2, 151-168, 1994, which is incorporated herein by reference in its entirety, or alternatively as a look-up table (LUT), or alternatively implemented in the way described in C. Mazenc, "Computing Functions $\cos^{-1}$ and $\sin^{-1}$ using cordic", IEEE Transactions on Computers, Volume 42, Number 1, 118-122, 1993, which is incorporated herein by reference in its entirety.

Thus far, the instances of a signal splitting component 10 illustrated have been limited to 2-component PA systems. FIGS. 9 and 10 illustrate how to combine multiple instances of a signal splitting component 10 in order to accommodate 3-component PA systems and 4-component. PA systems respectively, and by mathematical induction, n-component PA systems, which are further enabling for wideband system applications.

FIG. 9A illustrates a 3-component signal splitting component provided in accordance with one aspect of the present application. The 3-component signal splitting component includes a first signal splitting component 10 for receiving the input signal, and for producing split signals a and b respectively according to the techniques disclosed herein, a second signal splitting component 10 for receiving split signal b and for producing split signals c and d respectively according to the techniques disclosed herein, and a delay component 34 for receiving the split signal a and producing a time delayed split signal a', wherein the delay is substantially equal to the time required for producing the split signals c and d by the second signal splitting component 10.

FIG. 9B illustrates exemplary unitary constraints 36 which can be utilized by the signal splitting components of FIG. 9a: $(a/in)^2+(b/in)^2=1$ and $(c/b)^2+(d/b)^2=1$. These constraints 36 would result is small variations of the derived gain component 20 block shown in FIG. 8, without an increase in complexity and this despite the choice of direct gain component 18, the variations being within the scope of the present application.

FIG. 10A illustrates a 4-component signal splitting component provided in accordance with one aspect of the present application. The 4-component signal splitting component includes a first signal splitting component 10 for receiving the input signal, and for producing split signals a and b respectively according to the techniques disclosed herein, a second signal splitting component 10 for receiving split signal a and for producing split signals c and d respectively according to the techniques disclosed herein, and a third signal splitting component for receiving split signal b and producing split signals e and f according to the techniques disclosed herein.

FIG. 10B illustrates exemplary unitary constraints 36 which can be utilized by the signal splitting components of FIG. 10a: $(a/in)^2+(b/in)^2=1$, $(c/a)^2+(d/a)^2=1$, $(e/b)^2+(f/b)^2=1$. These constraints 36 would result is small variations of the derived gain component 20 block shown in FIG. 8, without an increase in complexity and this despite the choice of direct gain component 18, the variations being within the scope of the present application.

In view of FIGS. 9 and 10 and the techniques taught by the present application, a person of ordinary skill in the art is enabled to expand to a general case n-component signal splitting component 10 by combining an appropriate number of instances of a signal splitting component 10 and/or instances of and/or variations of a delay component 34, and all such enabled n-component signal splitting component embodiments are to be considered to be within the scope of the present application.

Since other modifications and changes varied to fit particular operating requirements and environments will be apparent to those skilled in the art, the application is not considered limited to the examples chosen for purposes of disclosure, and covers all changes and modifications which do not constitute departures from the true spirit and scope of this application.

The above-described embodiments of the present application are intended to be examples only. Those of skill in the art may effect alterations, modifications and variations to the particular embodiments without departing from the scope of the application, which is set forth in the claims.

What is claimed is:

1. A signal splitting apparatus suitable for use in a power amplifier having two or more power amplifier components, comprising:
    a direct gain component, for receiving an input signal and for providing a direct gain which when multiplied by the input signal provides a direct split signal; and
    a derived gain component, for receiving a derived input signal and for providing a derived gain which when multiplied by the input signal provides a derived split signal, connected to said direct gain component.

2. The signal splitting apparatus according to claim 1, wherein the derived input signal is the input signal.

3. The signal splitting apparatus according to claim 2, wherein the direct gain component includes an amplitude component, an address generator, and a look-up table component such that the amplitude component operates directly on the input signal to provide an amplitude which is mapped to an address by the address generator, the address then being used to look-up the value of the direct gain in the look-up table.

4. The signal splitting apparatus according to claim 1, wherein the direct gain component includes a static memory structure for storing Q_s samples of the input signal and providing P data taps, and a static combining structure for combining the products of the P data taps with P coefficients to provide the direct gain.

5. The signal splitting apparatus according to claim 1, wherein the derived gain component derives the derived gain from the direct gain by imposing a constraint which is valid over the entire dynamic range of the input signal.

6. The signal splitting apparatus according to claim 5, wherein the constraint is that the sum of the power of the direct split signal and the derived split signal is substantially equal to the power of the input signal.

7. The signal splitting apparatus according to claim 6, wherein the derived gain component includes a square root component such that the square root component produces the derived gain by taking the square root of unity minus the square of the direct gain.

8. The signal splitting apparatus according to claim 7, wherein the derived gain component includes a multiplier to implement the square of the direct gain by multiplying the direct gain with itself.

9. The signal splitting apparatus according to claim 7, wherein the derived gain component includes an adder for implementing the unity minus the square of the direct gain by subtracting the square of the direct gain from unity.

10. The signal splitting apparatus according to claim 2, further comprising:
    a second direct gain component, for receiving a second input signal including one of the direct signal and the derived signal and for providing a second direct gain which when multiplied by the second input signal provides a second direct split signal; and
    a second derived gain component, for receiving a second derived input signal and for providing a second derived gain which when multiplied by the second input signal provides a second derived split signal, connected to said second direct gain component.

11. The signal splitting apparatus according to claim 10, wherein the second derived input signal is the second direct gain.

12. The signal splitting apparatus according to claim 10, wherein the second derived input signal is the second input signal.

13. The signal splitting apparatus according to claim 10, wherein the second derived gain component derives the second derived gain from the second derived input signal by imposing a second constraint which is valid over the entire dynamic range of the second input signal.

14. The signal splitting apparatus according to claim 13, wherein the second constraint is that the sum of the power of the second direct split signal and the second derived split signal is substantially equal to the power of the second input signal.

15. The signal splitting apparatus according to claim 14, wherein the second derived gain component includes a square root component such that the square root component produces the second derived gain by taking the square root of the square of one of the direct gain and the derived gain minus the square of the second direct gain.

16. The signal splitting apparatus according to claim 15, wherein the second derived gain component includes a multiplier to implement the square of the second direct gain by multiplying the second direct gain with itself.

17. The signal splitting apparatus according to claim 15, wherein the second derived gain component includes a multiplier to implement the square of one of the direct gain and the derived gain by multiplying the one of the direct gain and the derived gain with itself.

18. The signal splitting apparatus according to claim 15, wherein the second derived gain component includes an adder for implementing the square of one of the direct gain and the derived gain minus the square of the second direct gain by subtracting the square of the second direct gain from the square of one of the direct gain and the derived gain.

19. The signal splitting apparatus according to claim 10, further comprising a delay element for receiving one of the direct split signal and the derived split signal and for providing a delayed split signal having a delay substantially equal to the time required to produce the respective other of the direct split signal and the derived split signal.

20. The signal splitting apparatus according to claim 10, further comprising:
   a third direct gain component, for receiving a third input signal including one of the second direct signal and the second derived signal and for providing a third direct gain which when multiplied by the third input signal provides a third direct split signal; and
   a third derived gain component for receiving a third derived input signal and for providing a third derived gain which when multiplied by the third input signal provides a third derived split signal, connected to said third direct gain component.

21. The signal splitting apparatus according to claim 20, wherein the third derived input signal is the third input signal.

22. The signal splitting apparatus according to claim 20, wherein the third derived input signal is the third direct gain.

23. The signal splitting apparatus according to claim 20, further comprising one or more additional direct gain components, and one or more additional derived gain components, each connected to said one or more additional direct gain components.

24. A radio frequency transmit circuit including a high-efficiency power amplifier, the high-efficiency power amplifier including the signal splitting apparatus according to claim 1.

25. The radio frequency transmit circuit according to claim 24, wherein the high-efficiency power amplifier employs a topology including one of Doherty and Chirex.

* * * * *